(12) United States Patent
Grunzke (10) Patent No.: US 12,235,760 B2
(45) Date of Patent: Feb. 25, 2025

(54) APPARATUS HAVING SELECTIVELY-ACTIVATED TERMINATION CIRCUITRY

(71) Applicant: Lodestar Licensing Group LLC, Evanston, IL (US)

(72) Inventor: Terry Grunzke, Boise, ID (US)

(73) Assignee: Lodestar Licensing Group LLC, Evanston, IL (US)

( * ) Notice: Subject to any disclaimer, the term of this patent is extended or adjusted under 35 U.S.C. 154(b) by 121 days.

(21) Appl. No.: 17/851,273

(22) Filed: Jun. 28, 2022

(65) Prior Publication Data

US 2023/0016415 A1 Jan. 19, 2023

Related U.S. Application Data

(60) Continuation of application No. 17/098,491, filed on Nov. 16, 2020, now Pat. No. 11,379,366, which is a
(Continued)

(51) Int. Cl.
*G06F 12/06* (2006.01)
*G06F 13/16* (2006.01)
(Continued)

(52) U.S. Cl.
CPC ...... *G06F 12/0653* (2013.01); *G06F 12/0661* (2013.01); *G06F 13/16* (2013.01);
(Continued)

(58) Field of Classification Search
CPC .. G06F 12/0653; G06F 12/0661; G06F 13/16; G06F 13/18; G11C 7/10; G11C 7/20; G11C 7/22; G11C 16/06; Y02D 10/00
See application file for complete search history.

(56) References Cited

U.S. PATENT DOCUMENTS 5,798,980 A 8/1998 McClure
7,243,290 B2 7/2007 Slavin
(Continued)

FOREIGN PATENT DOCUMENTS

CN 1072528 A 5/1993
CN 101416166 A 4/2009
(Continued)

OTHER PUBLICATIONS

European Communication pursuant to Article 94(3) EPC for European Application No. 11816950.7, dated Dec. 20, 2016, 6 pages.
(Continued)

*Primary Examiner* — Jae U Yu
(74) *Attorney, Agent, or Firm* — TraskBritt (57) ABSTRACT

Apparatus might include a first plurality of signal lines, a second plurality of signal lines, a controller, a first die, and a second die. The controller, the first die, and the second die might each be connected to the first plurality of signal lines and connected to the second plurality of signal lines. The first die and the second die might each include termination circuitry connected to a particular signal line of the second plurality of signal lines. The first die might be configured to activate its termination circuitry in response to receiving a particular combination of signal values on the first plurality of signal lines. The second die might be configured to deactivate its termination circuitry in response to receiving the particular combination of signal values on the first plurality of signal lines.

25 Claims, 9 Drawing Sheets

Related U.S. Application Data continuation of application No. 16/166,222, filed on Oct. 22, 2018, now Pat. No. 10,860,479, which is a continuation of application No. 15/355,621, filed on Nov. 18, 2016, now Pat. No. 10,152,414, which is a continuation of application No. 14/208,965, filed on Mar. 13, 2014, now Pat. No. 9,529,713, which is a division of application No. 12/856,000, filed on Aug. 13, 2010, now Pat. No. 8,688,955.

(51) Int. Cl.
| | |
|---|---|
| G06F 13/18 | (2006.01) |
| G11C 5/00 | (2006.01) |
| G11C 7/10 | (2006.01) |
| G11C 7/20 | (2006.01) |
| G11C 7/22 | (2006.01) |
| G11C 16/06 | (2006.01) |
| H04L 25/02 | (2006.01) |

(52) U.S. Cl.
CPC ............... *G06F 13/18* (2013.01); *G11C 5/00* (2013.01); *G11C 7/10* (2013.01); *G11C 7/20* (2013.01); *G11C 7/22* (2013.01); *G11C 16/06* (2013.01); *H04L 25/0298* (2013.01); *H04L 25/0278* (2013.01); *Y02D 10/00* (2018.01)

(56) References Cited

U.S. PATENT DOCUMENTS

| | | | |
|---|---|---|---|
| 7,516,281 | B2 | 4/2009 | LaBerge |
| 2001/0003837 | A1 | 6/2001 | Norman et al. |
| 2006/0050597 | A1 | 3/2006 | Janzen |
| 2006/0248268 | A1* | 11/2006 | Roohparvar ........... G11C 29/72 711/103 |
| 2007/0069213 | A1 | 3/2007 | Lee et al. |
| 2007/0247185 | A1 | 10/2007 | Oie et al. |
| 2007/0279084 | A1 | 12/2007 | Oh et al. |
| 2008/0030221 | A1 | 2/2008 | Lee et al. |
| 2008/0315913 | A1 | 12/2008 | Kim |
| 2009/0063789 | A1 | 3/2009 | Greeff et al. |
| 2009/0240897 | A1* | 9/2009 | Kajigaya ............ G06F 13/1657 711/149 |
| 2011/0161553 | A1 | 6/2011 | Saxena et al. |

FOREIGN PATENT DOCUMENTS

| | | | |
|---|---|---|---|
| JP | 51-002363 | A | 1/1976 |
| JP | 51-081537 | A | 7/1976 |
| JP | 2001-069179 | A | 3/2001 |
| JP | 2003-068082 | A | 3/2003 |
| JP | 2006-516059 | A | 6/2006 |
| JP | 2008-521158 | A | 6/2008 |

OTHER PUBLICATIONS

European Communication pursuant to Article 94(3) EPC for European Application No. 18172012.9, dated Jul. 30, 2019, 6 pages.
European Search Report and Search Opinion Received for EP Application No. 18172012.9, dated on Aug. 30, 2018, 9 pages.
International Search Report for International Application No. PCT/US11/47164, mailed Jan. 2, 2012, 3 pages.
International Written Opinion for International Application No. PCT/US11/47164, mailed Jan. 2, 2012, 3 pages.
Supplementary European Search Report and Search Opinion Received for EP Application No. 11816950.7, dated on Apr. 11, 2014, 7 pages.
ONFi—Open NAND Flash Interface Specification Revision 2.2, Oct. 7, 2009, pp. Cover, ii, 29-30, 32, 48-64, 114-115, http://onfi.org/specifications.
Chinese First Office Action for Chinese Application No. 201180043628.4, dated Aug. 20, 2014, 20 pages with translation.
Chinese First Office Action for Chinese Application No. 201610405097.3, dated Feb. 5, 2018, 12 pages with translation.
Chinese Second Office Action for Chinese Application No. 201180043628.4, dated Apr. 3, 2015, 17 pages with translation.
Chinese Third Office Action for Chinese Application No. 201180043628.4, dated Sep. 23, 2015, 5 pages with translation.
Japanese Decision to Grant a Patent for Japanese Application No. 2013-524188, dated Sep. 2, 2014, 5 pages with English translation.
Japanese Notice of Reasons for Refusal for Japanese Application No. 2013-524188, dated Dec. 3, 2013, 11 pages with English translation.
Korean Request for the Submission of an Opinion received for Korean Patent Application No. 10-2013-7006149, mailed on May 30, 2014, 6 pages With English Translations.
Korean Written Decision on Registration received for Korean Patent Application No. 10-2013-7006149, mailed on Nov. 28, 2014, 2 pages With English Translations.
Taiwanese Search Report and Office Action from Taiwanese Application No. 100128964, dated Oct. 14, 2014, 11 pages with English translation.

* cited by examiner

| | TERMINATION REGISTER | |
|---|---|---|
| | TARGET ADDRESS | TERMINATION VALUE |
| 1 | ADDRESS 1 | → TERM VALUE 1 |
| 2 | ADDRESS 2 | → TERM VALUE 2 |
| 3 | ADDRESS 3 | → TERM VALUE 3 |
| 4 | ADDRESS RANGE | → TERM VALUE 4 |
| N | ADDRESS N | → TERM VALUE N |

APPARATUS HAVING SELECTIVELY-ACTIVATED TERMINATION CIRCUITRY

CROSS-REFERENCE TO RELATED APPLICATIONS

This application is a Continuation of U.S. application Ser. No. 17/098,491, titled "MEMORY DEVICES HAVING SELECTIVELY-ACTIVATED TERMINATION DEVICES," filed Nov. 16, 2020, now U.S. Pat. No. 11,379,366, issued Jul. 5, 2022, which is a Continuation of U.S. application Ser. No. 16/166,222, titled "LINE TERMINATION METHODS," filed Oct. 22, 2018, now U.S. Pat. No. 10,860,479, issued Dec. 8, 2020, which is a Continuation of U.S. application Ser. No. 15/355,621, titled "LINE TERMINATION METHODS," filed Nov. 18, 2016, now U.S. Pat. No. 10,152,414, issued Dec. 11, 2018, which is a Continuation of U.S. patent application Ser. No. 14/208,965, titled "LINE TERMINATION METHODS AND APPARATUS," filed Mar. 13, 2014, now U.S. Pat. No. 9,529,713, issued Dec. 27, 2016, which is a Divisional of U.S. patent application Ser. No. 12/856,000, titled "LINE TERMINATION METHODS AND APPARATUS," filed Aug. 13, 2010, now U.S. Pat. No. 8,688,955, issued Apr. 1, 2014, the disclosure of each of which is commonly assigned and incorporated herein by reference.

TECHNICAL FIELD

The present disclosure relates generally to signal lines in electronic devices and, in particular, in one or more embodiments, the present disclosure relates to line termination using non-volatile memory devices.

BACKGROUND

Time varying signals in electronic devices are utilized to transfer information (e.g., data) over one or more conductors often referred to as signal lines. These signal lines are often bundled together to form a communications bus, such as an address or data bus, for example. Termination is often used on these busses in order to reduce certain transmission line effects due to various electrical properties of the bus. For example, a mismatch in characteristic impedance of two signal lines coupled together can result in reflections. Capacitive and inductive effects can also cause undesirable issues with signal integrity. Thus, it is typically desirable to reduce these effects in order to reduce the likelihood of data corruption as the data is transmitted on a bus.

Memory devices are an example of devices that often utilize address and data busses. Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged and accessed. Typically, the array of memory cells for NAND flash memory devices is arranged such that memory cells of a string are connected together in series, source to drain.

To meet the demands for higher data read and write transfer rates, designers continue to strive for increasing the access speed of memory devices and systems. Memory systems often are comprised of multiple memory device packages (e.g., die) which are coupled together on a common circuit board and communicate on a common data bus, for example. However, one issue with increased data transfer rates is maintaining signal integrity during these bursts of data on the various bus signal lines of the memory system. As these transfer rates increase, the impedance characteristics of a data bus become more pronounced. Capacitive and inductive characteristics of the circuit board may begin to distort the signal waveforms on the data bus at these higher data rates.

Waveforms may begin to spread out and/or reflections may occur at locations of unmatched impedance on the data bus signals, for example.

For the reasons stated above, and for other reasons stated below which will become apparent to those skilled in the art upon reading and understanding the present disclosure, there is a need in the art for alternative termination methods and apparatus in various memory device architectures.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense.

One method used to improve signal integrity in high data rate applications is to use what is referred to as On-Die Termination (ODT). ODT may be utilized by configuring each of the data nodes (e.g., data outputs) of a particular memory device (e.g., die or package) coupled to the system data bus to act (e.g., function) as a termination device for each line (e.g., signal line) of the data bus. For example, for a particular die to act as a termination device (e.g., a terminating memory device), a pull-up and pull-down resistor configured as a voltage divider might be coupled to each data node of the termination device. Thus, the data nodes of the termination device act as bus terminators for the data bus for which they are coupled.

One particular issue with current ODT methods is that a memory device is selected to act as a termination device by utilizing discrete control signals to direct each memory device when to act as a termination device. Or, a combination of control signals are utilized to indicate a termination mode command. Both of these methods require additional logic to configure these control signals and/or additional signal lines to be added to a memory system, which consume real estate on a circuit board and may cause additional undesirable effects, such as noise issues, for example. In contrast to current ODT methods, various embodiments of the present disclosure facilitate selection of a termination device wherein the termination device is responsive to receiving a particular address, for example.

Figure 1:
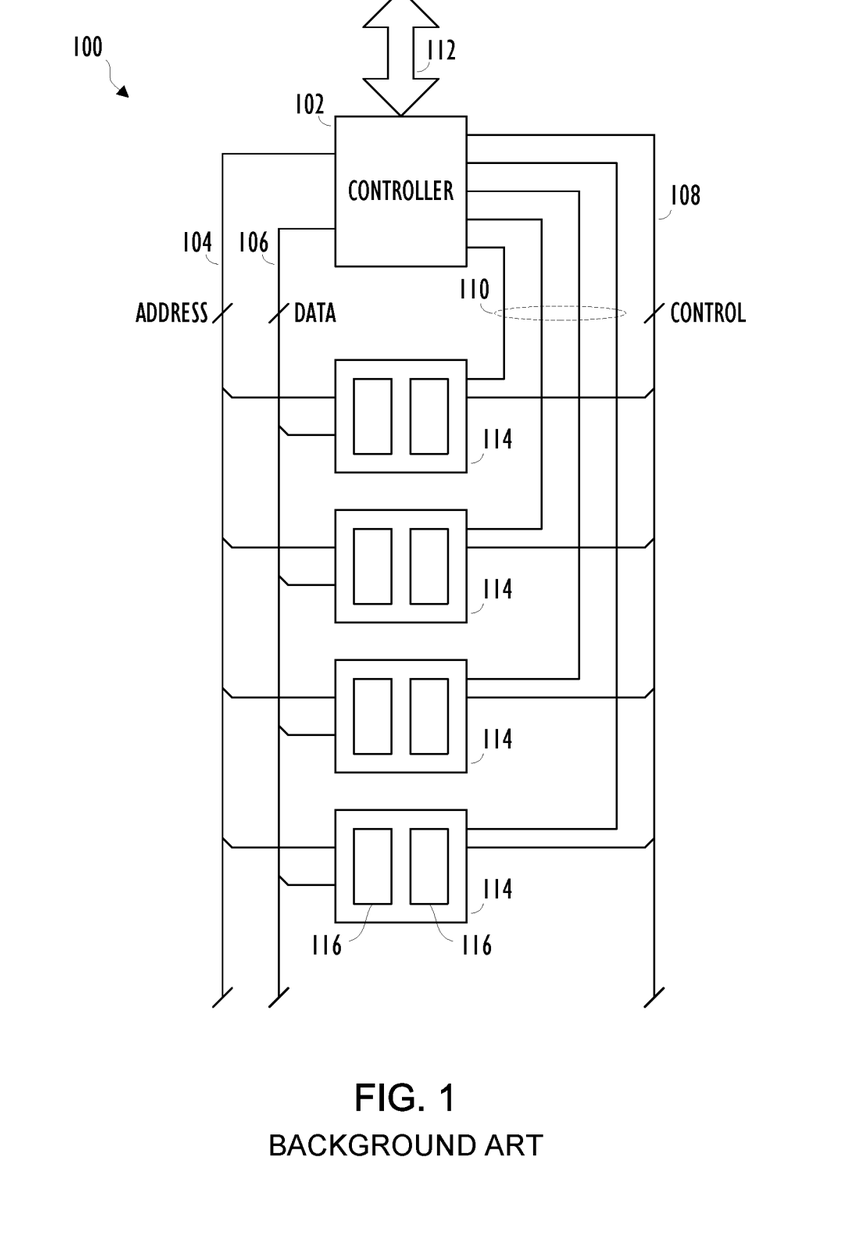
FIG. 1 shows a functional block diagram of a typical memory system.

A typical memory system 100 is shown in FIG. 1. The memory system 100 of FIG. 1 might be mounted on a single circuit board (not shown), for example. Coupling to the memory system 100 can be achieved by way of an interface 112. The interface 112 might comprise a plurality of conductive pads (e.g., edge connector) formed on the circuit board. The interface 112 might also be one of a mechanical type of multi-conductor connectors as are known to those skilled in the art, for example. The interface 112 allows for the memory system 100 to be coupled to another electronic system (not shown). The memory system 100 might be coupled through interface 112 to a personal computer (PC), digital camera, or electronic test equipment, for example.

Memory system 100 further comprises a controller 102 which regulates various operations within the memory system 100 as well as providing interactivity with a system coupled to the interface 112, for example. In addition to the controller 102, memory system 100 further comprises one or more memory devices 114. Each memory device 114 might be further comprised of additional memory packages 116 (e.g., die). Each memory device 114 is coupled to the controller 102 by a common address bus 104. The address bus 104 might comprise twelve bus signal lines, for example. Memory devices 114 are also coupled to the controller 102 by a common data bus 106. The data bus 106 might comprise sixteen (e.g., D0-D15) bus signal lines, for example.

Each of the memory devices 114 are also coupled to the controller 102 through one or more common control signals 108. Control signals 108 might comprise signals that are commonly applied to each memory device 114. For example, control signals 108 might comprise clock and/or other synchronization control signals known to those skilled in the art. Memory devices 114 may also be coupled to the controller 102 through additional memory device specific discrete control signals 110. The control signals 110 provide one or more control signals to only a specific memory device 114, such as a chip select (CS) signal, for example. Typical memory devices/systems utilizing ODT, such as discussed above, might also have additional discrete control signals 110 to indicate when a particular memory device 114 is to act as the termination device in the memory system 100, for example.

Figure 2:
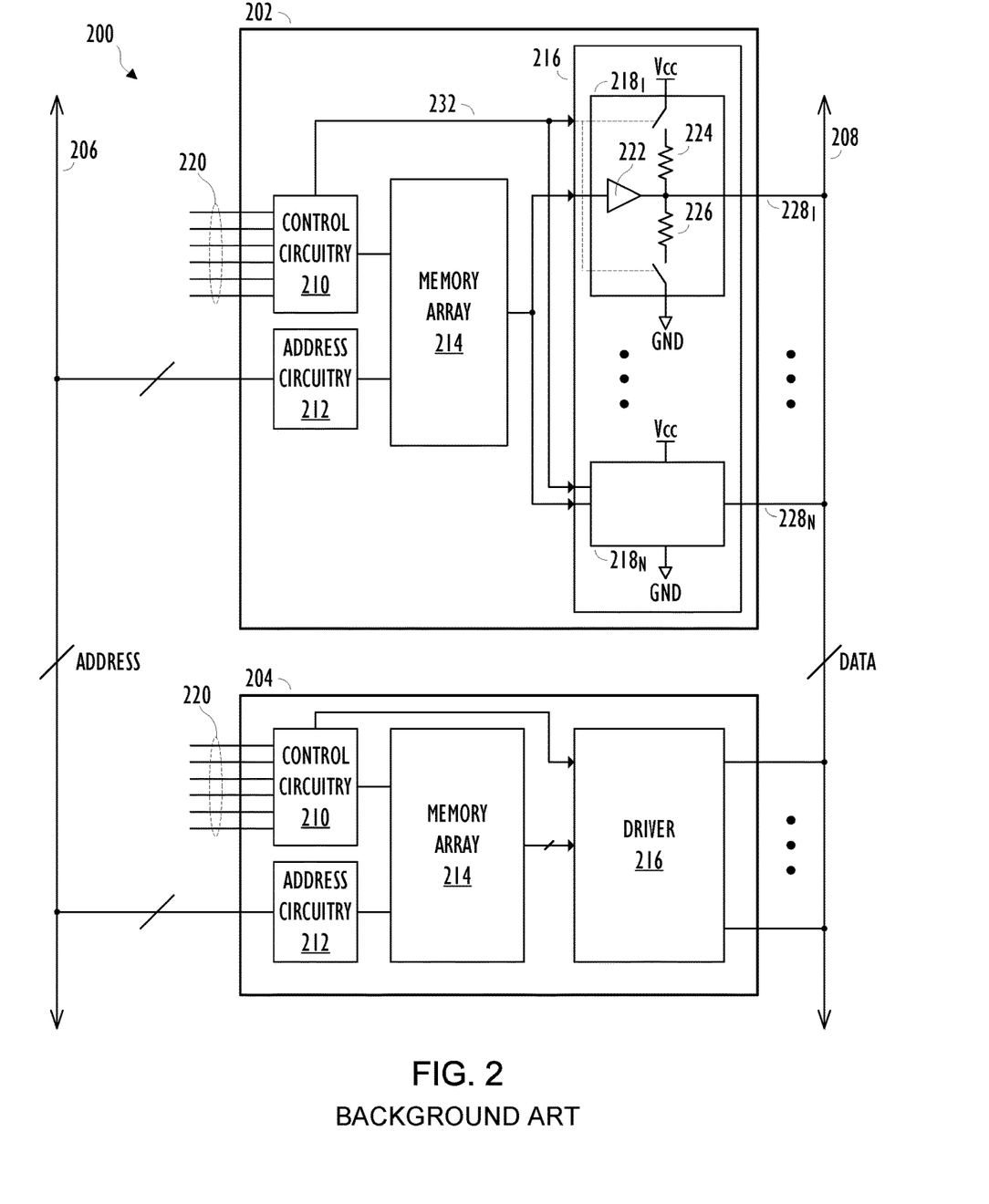
FIG. 2 shows a functional block diagram of a typical memory system utilizing On-Die Termination (ODT).

A typical memory system 200 similar to memory system 100 and comprising memory devices 202, 204 configured to utilize ODT can be described by way of reference to FIG. 2. The memory system 200 of FIG. 2 comprises a controller (not shown) such as controller 102 discussed with respect to FIG. 1, for example. The memory system 200 of FIG. 2 shows a more detailed illustration of memory devices 204, 204, such as memory devices 114 shown in FIG. 1. Each memory device 202, 204 is coupled to the controller by an address bus 206, data bus 208 and a plurality of control signals 220. Control signals 220 shown coupled to each memory device 202, 204 might comprise both commonly coupled and memory device specific control signals, for example.

Memory device 202 further illustrates a more detailed view of the elements of a typical memory device configured for ODT operation in response to control signals 220. Memory device 202 comprises address circuitry 212 which is coupled the address bus 206 in order to receive addressing information from the controller in order to access the memory array 214 of the device. Memory device 202 further comprises control circuitry 210 which is coupled to control signals 220 and is configured to manage operations within the memory device 202, such as read and write operations to be performed on the memory array 214, for example. Control circuitry 210 is also configured to manage operations within the output driver 216 of the memory device. These operations might include placing the individual output drivers 218, and thus the data nodes $228_{1-N}$, in a high impedance, driving or termination mode, for example. The output drivers 218 might be placed in a high impedance mode when the memory device is not selected for a particular memory device operation so as to prevent any bus contention on the data bus 208. The output drivers 218 might be placed in a driving mode by enabling a driver 222 when the memory device 202 is selected to drive the data bus to a particular state, such as in response to a read operation from the memory device, for example.

Memory device 202 might also be placed in a termination mode. In termination mode, the individual output drivers $218_{1-N}$ couple (e.g., switch in) a pull-up 224 and a pull-down 226 resistance to each data node $228_{1-N}$ of the termination device, such as is shown in detail in output driver 2181, for example. These resistances 224, 226 are switched in and out responsive to a signal 232 provided by control circuitry 210. The pull-up and pull-down resistances are decoupled (e.g., switched out) from the data nodes $228_{1-N}$ when the output drivers $218_{1-N}$ of the memory device 202 are in the high impedance and/or the driving modes, for example.

Figure 3:
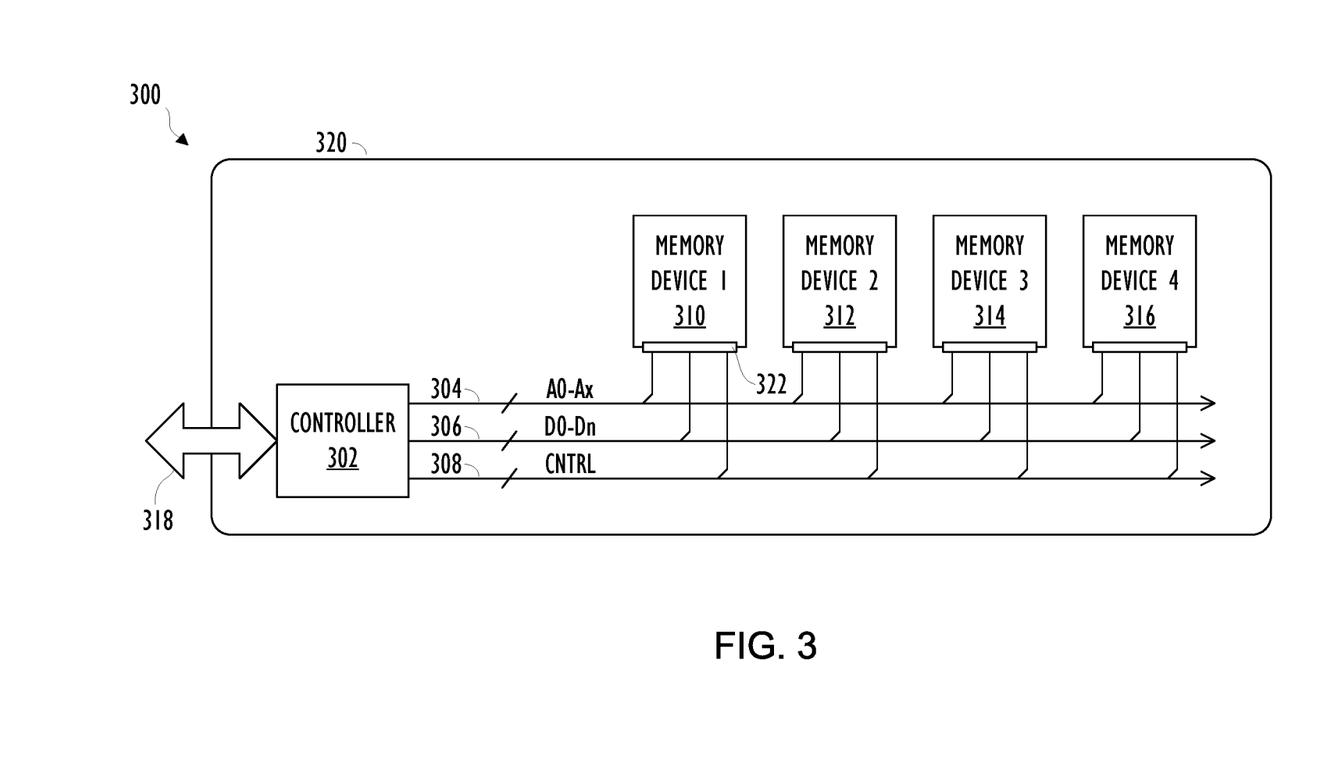
FIG. 3 shows a functional block diagram of a memory system according to an embodiment of the present disclosure.

FIG. 3 illustrates a memory system 300 according to various embodiments of the present disclosure. The memory system 300 illustrated in FIG. 3 comprises a controller 302 and four memory devices 310-316 configured (e.g., physically arranged and mounted) on a printed circuit board (PCB) 320, for example. The components of the memory system, such as controller 302 and/or memory devices 310-316, might be mounted on one or both sides of the PCB 320. The PCB 320 might be a single or a multiple layer PCB, for example.

Memory system 300 further comprises an interface 318, such as an electromechanical connector or other type of connector (e.g., edge connector), which allows the memory system 300 to be coupled to a host or other system (not shown). Memory system 300 also comprises an address bus (A0-Ax) 304, data bus (D0-Dn) 306 and one or more control signals (CNTRL) 308. Individual control signals of 308 are not shown to improve readability of the figure. Control signals 308 might comprise control signals such as Address Latch Enable (ALE), Command Latch Enable (CLE), data strobe (DQS) and a clock signal (CLK), for example. Other control signals are known to those skilled in the art. The address bus 304, data bus 306 and control signals 308 are all shown independent of each other in FIG. 3. However, the address 304 bus, data bus 306, and control signals 308 may all be combined or may be combined in part according to various embodiments of the present disclosure. The address bus and the data bus might comprise the same physical bus according to one or more embodiments of the present disclosure, for example.

Memory devices 310-316 each comprise an interface 322. For example, the interface 322 of each memory device 310-316 might comprise a number of data nodes, such as terminals providing a coupling location with the signal lines 304, 306, 308 of the memory system 300. The terminals might comprise an electromechanical type connection. The terminals of the interface 322 might also comprise a soldered lead connection to the signal lines of the memory system, for example. Thus, a memory device 310-316 configured to operate as a termination device according to various embodiments of the present disclosure facilitates adjustment of the input impedance at one or more of the terminals of its interface 322, for example. By adjusting the input impedance characteristic seen by a signal line coupled to a particular terminal of an interface 322, signal line termination can be facilitated for the particular signal line, which is coupled to the terminal, for example.

Memory devices 310-316 might also be comprised of one or more memory packages (e.g., die) (not shown), for example. Although four memory devices are shown in FIG. 3, various embodiments of the present disclosure are not so limited. The memory system 300 might comprise one or more memory devices according to various embodiments of the present disclosure, for example.

One or more of the memory devices 310-316 of FIG. 3 are configured to operate as termination devices according to various embodiments of the present disclosure. For example, Memory Device 1 310 might have been previously selected (e.g., appointed) to act as a termination device for Memory Device 4 316. Thus, a selected (e.g., target) address comprising an address corresponding to Memory Device 4 316 (e.g., a physical address in Memory Device 4) will be stored in Memory Device 1 310. The target address might be stored in a non-volatile portion of Memory Device 1 310 where it is loaded into a particular register as part of an initialization operation, such as following a RESET and/or power up operation, for example. According to one or more embodiments, the target address might be appointed by a controller external to Memory Device 1 310 and the target address is loaded into the memory device register as part of an initialization operation. Following initialization, Memory Device 1 310 monitors one or more signal lines of the address bus 304. Memory Device 4 316 might then be targeted for a memory device operation to be performed, such as a read or write operation, for example.

An address corresponding to Memory Device 4 316 is then transmitted over the address bus 304 to access Memory Device 4 316 in order to perform the intended memory device operation. The address transmitted over the address bus 304 will be received by both Memory Device 1 310 and Memory device 4 316 as they are both commonly coupled to the address bus 304. As Memory Device 1 310 has been appointed to act as a termination device for Memory Device 4 316, Memory Device 1 310 will respond by entering a termination mode, which can include selecting (e.g., activating) termination circuitry (not shown) within Memory Device 1 310.

Although only Memory Device 1 310 has been described as monitoring the address bus 304 and activating its termination circuitry in response to receiving a particular target address, the various embodiments of the present disclosure are not so limited. For example, each memory device 310-316 might monitor the address bus 304. Upon receiving an indication that a memory device operation is to be performed, each memory device 310-316 might compare the address received with the target address stored in each memory device to determine if the memory device is to enter a termination mode during the current memory device operation to be performed. Memory devices not appointed to act as termination devices for the current memory device operation might then return to monitoring the address bus without activating their termination circuitry.

Memory system 300 might be comprised of all memory devices 310-316 configured to act as a termination device according one or more embodiments of the present disclosure. Additional embodiments might comprise a memory system wherein a subset of memory devices are configured to act as termination devices. For example, Memory Device 1 310 and Memory Device 3 314 might be configured to function in a termination mode according to one or more embodiments, wherein Memory Devices 2 312 and Memory Device 4 316 that be memory devices that are not configured for termination mode functionality, for example. According to various embodiments, one or more of the memory devices might be configured to operate in a termination mode at the same time.

In one or more embodiments where each of memory devices 310-316 comprises one or more die, for example, each of the die can be configured to act as a termination device. Additional embodiments might comprise a memory system wherein a subset of the die of each memory device 310-316 are configured to act as termination devices. In such embodiments, for example, if a target address corresponds to a first die in Memory Device 1 310, then one or more die in Memory Device 2 312, for example, might be configured to function in a termination mode. Thus, according to one or more embodiments, any number of die in any number of memory devices of the memory system 300 might be configured to function in a termination mode at a particular time, such as during a memory device operation, for example. It should be noted that a particular die in a particular memory device can act as a termination device for itself and/or another die of the particular memory device according to various embodiments of the present disclosure.

Having two or more die functioning as termination devices in parallel should reduce overall chip capacitance by a factor of the number of die functioning as termination devices and the termination value (e.g., termination resistance) of each of the termination devices, and can lessen the drop on input/output (I/O) power busses. In addition, in embodiments where the only die functioning as termination devices are in just one of Memory Devices 310-316, the termination devices are believed to be electrically close enough to act as a single termination device, which should avoid reflections. Furthermore, according to one or more embodiments, each die of each memory device can be configured with the same or different termination values, or a combination thereof, providing for more flexible options.

Figure 4:
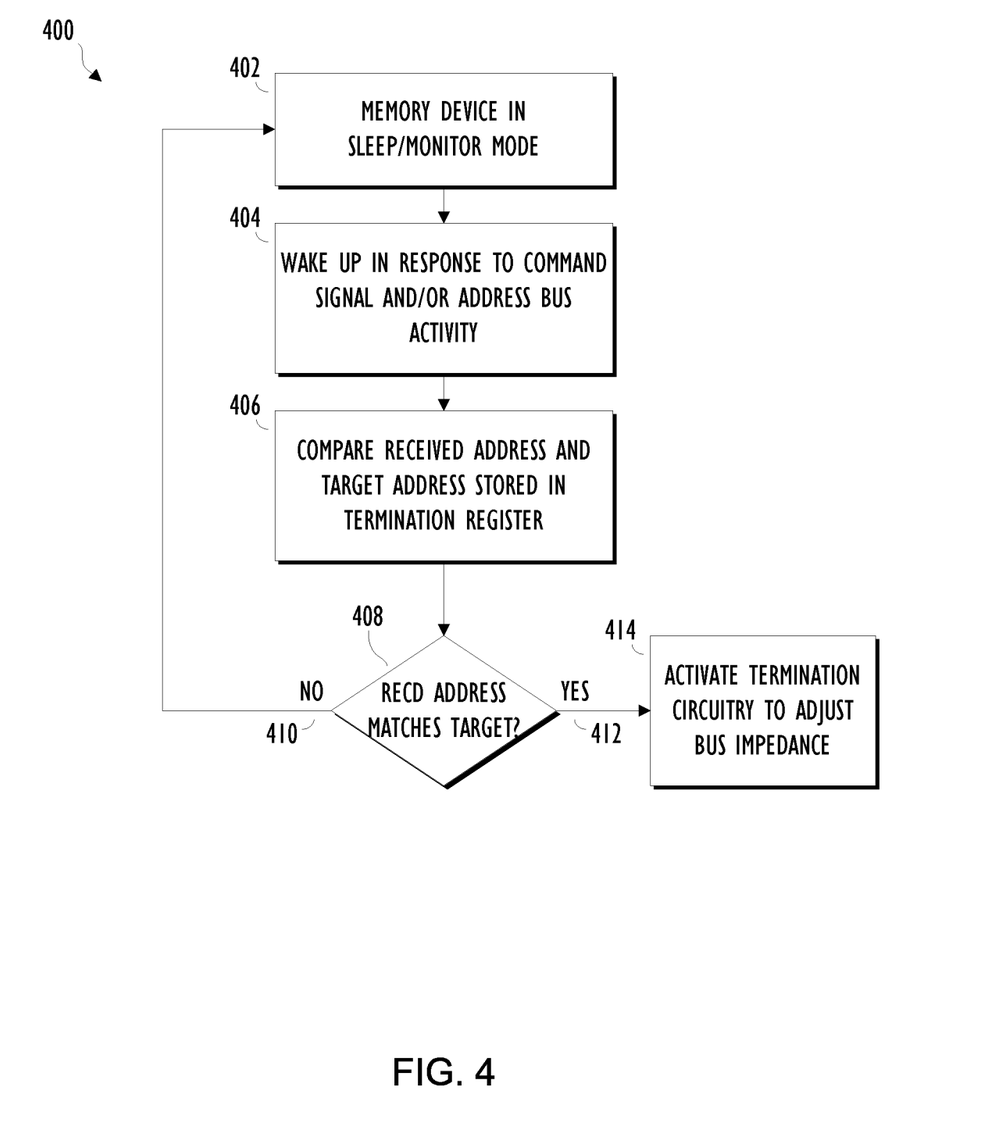
FIG. 4 shows a flowchart of a termination operation according to an embodiment of the present disclosure.

FIG. 4 illustrates a method of operating one or more memory devices 400 in a memory system, such as memory system 300, according to various embodiments of the present disclosure. The one or more memory devices of the memory system may operate in a sleep (e.g., monitor) mode 402, wherein the memory devices wait (e.g., 'snoop') for an indication that a particular memory device operation is to be performed in the memory system. Upon receiving an indication of a memory device operation is to be performed 404, the memory devices "wake up" from sleep mode. Indication of an upcoming memory device operation might be from address bus 304 activity and/or particular activity on the various control signal lines 308 of the memory system 300, for example. Memory devices waiting in a sleep mode facilitate a reduction in power usage by the memory system, which is often desirable in many electronic devices, such as battery powered devices, for example.

Upon receiving the address transmitted on the address bus to identify a memory device for the memory device operation, a comparison is made 406 in each memory device. This comparison is made to determine if the received address matches the target address stored in each of the memory devices 408. It should be noted that the comparison 406 may be made in the memory device selected for the memory device operation as a memory device might act as a termination device for itself, according to various embodiments of the present disclosure. If there is no match between the received address and the target address stored in some or all of the memory devices 410, those memory devices will return to the sleep mode 402. However, the memory device selected for the memory device operation may remain awake or may temporarily return to the sleep mode before waking up prior to performing the memory device operation, for example. If a match occurs 412 between the received address and the stored target address in a memory device, that memory device can respond by activating termination circuitry within the memory device 414. Upon completion of the current memory device operation, the memory device may deactivate its termination circuitry and may also return to the sleep mode 402. The memory devices of the memory system may remain in the sleep mode 402 until another indication is detected to indicate that another memory device operation is to be performed in the memory system.

A memory device that has detected it is to act as a termination device might not activate its termination circuitry until the memory device operation has begun. For example, the termination device might be responsive to further activity on a control signal and/or responsive to activity on the address bus before activating its termination circuitry, for example. A termination device might also wait a specific period of time (e.g., a particular number of clock cycles) before activating its termination circuitry. By delaying the activation of the termination circuitry until the memory device operation has begun, additional power savings might be realized.

As discussed above, memory devices according to various embodiments of the present disclosure are appointed to act as termination devices during certain memory device operations, for example. A method 500 of appointing memory devices of a memory system to act as termination devices for the system according to various embodiments of the present disclosure is described by way of reference to FIG. 5 and FIG. 3, for example. As discussed above, one or memory devices may be physically arranged on a printed circuit board, for example. The physical layout of the circuit board can affect the characteristic impedances of the signal lines of the memory system. Trace lengths and widths, routing and circuit board materials can each affect the impedances of the signal lines of the memory system, for example. Thus, a system designer might perform an initial physical layout of the memory system 502.

Figure 5:
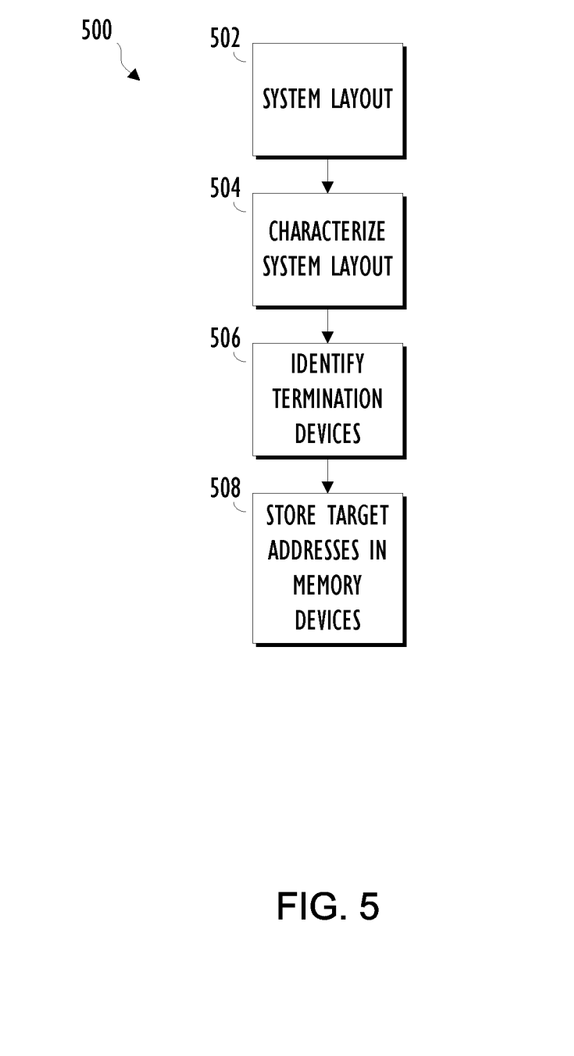
FIG. 5 shows a flowchart of a memory system characterization method according to an embodiment of the present disclosure.

Following the physical layout of the memory system 502, an analysis of the layout is performed to characterize the impedance characteristics of the various signal lines of the memory system 504. Additional analysis may then be performed to identify which memory devices might act as termination devices during various memory device operations that might be performed during operation of the memory system 506. Target addresses are then stored in the identified memory devices, which are to act as termination devices during operation of the memory system 508. By way of example, Memory Device 3 314 of FIG. 3 might be identified to act as a termination device for one or more memory device operations performed on Memory Device 1 310. The address of Memory Device 1 310 (e.g., target address) is then stored in Memory Device 3 314. Thus, Memory Device 3 314 has been appointed as the termination device for Memory Device 1 310 according to one or more embodiments of the present disclosure.

Figure 6:
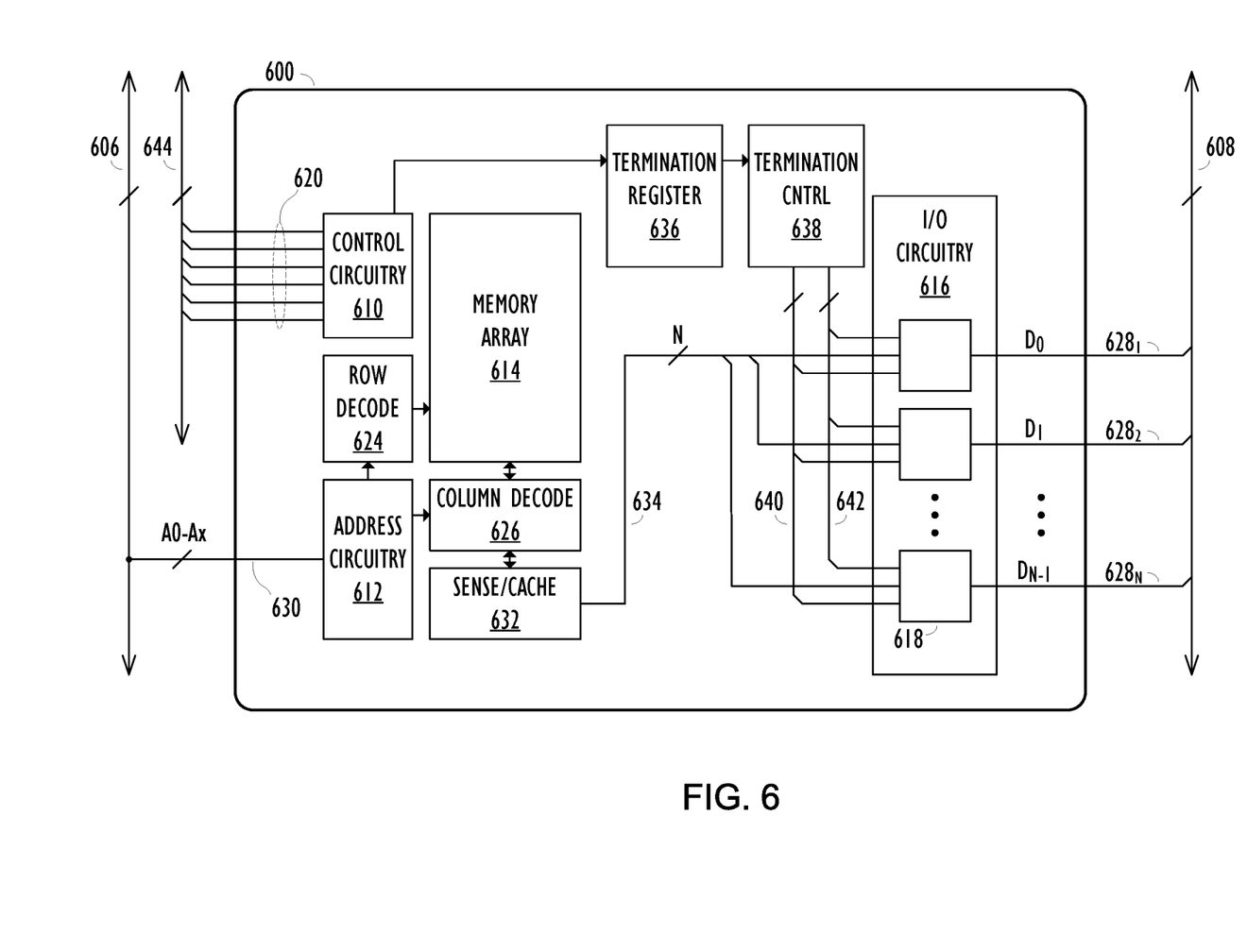
FIG. 6 shows a functional block diagram of a memory device configured to utilize ODT according to an embodiment of the present disclosure.

FIG. 6 illustrates a memory device 600 configured for ODT, such as Memory Devices 310-316 shown in FIG. 3, according to one or more embodiments of the present disclosure. Memory device 600 is shown to be coupled to a plurality of control signals 644, an address bus 606 and a data bus 608 which all might be coupled to a controller (not shown), such as controller 302 shown in FIG. 3, for example. Additional memory devices 600 (not shown) might also be coupled to the control signals 644, address bus 606 and data bus 608, for example.

Memory device 600 comprises one or more arrays 614 of memory cells that might be logically arranged in rows and in columns. According to one or more embodiments of the present disclosure, the memory cells of memory array 614 are non-volatile memory cells (e.g., Flash memory cells). The memory array 614 might also include multiple banks and blocks of memory cells residing on a single or multiple die as part of the memory device 600. Memory array 614 might comprise single level (SLC) and/or multilevel (MLC) memory cells. For example, single level memory cells (SLC) permit the storage of a single binary digit (e.g., bit) of data on each memory cell. Multilevel memory cells assign a data state (e.g., as represented by a bit pattern) to a specific range of threshold voltages (Vt) stored on the memory cell. MLC technology permits the storage of two or more binary digits per cell (e.g., 2, 4, 8, 16 bits), depending on the quantity of threshold voltage ranges assigned to the cell and the stability of the assigned threshold voltage ranges during the lifetime operation of the memory cell.

Address circuitry 612 is provided to latch address signals received on address signal lines A0-Ax 630. The address signals received on signal lines 630 are decoded by a row decoder 624 and a column decoder 626 to access the memory array 614. It will be appreciated by those skilled in the art, with the benefit of the present description, that the number of address input signal lines A0-Ax 630 depends on the density and architecture of the memory array 614. That is, the number of address digits A0-Ax increases with both increased memory cell counts and increased bank and block counts, for example.

The memory device 600 can read data in the memory array 614 by sensing voltage or current changes in the memory array columns using sense devices, such as sense/cache circuitry 632. The sense/cache circuitry 632, according to at least one embodiment, is coupled to read and latch a row of data from the memory array 614.

Data input and output (I/O) circuitry 616 facilitates bi-directional data communication over the plurality of data I/O nodes 628 coupled to the data bus 608. The I/O circuitry 616 comprises a number of output drivers 618 according to various embodiments of the present disclosure. Control circuitry 610 is configured to facilitate memory device operations, such as writing data to and/or in erasing data from the memory array 614. Data is transferred between the sense/cache circuitry 632 and the I/O circuitry 616 over signal lines 634, comprising N signal lines, for example.

Memory device 600 further comprises a termination register 636 which is configured to store termination information, such as one or more target addresses. According to one or more embodiments, the termination information might also include termination values (e.g., impedance characteristic to be obtained) associated with the stored target addresses. The termination register 636 may represent volatile or non-volatile storage within the memory device 600. Although not shown in the example of FIG. 6, the termination register 636 may be a portion of the memory array 614. The termination control circuitry 638 is configured to control termination circuitry comprising the output drivers 618 utilizing (e.g., driving), for example, the termination control signal lines 640 and 642. Control circuitry 610 is configured at least in part to facilitate various embodiments of the present disclosure. For example, control circuitry 610 might manage the operation of termination register 636 and the termination control circuitry 638.

Figure 7:
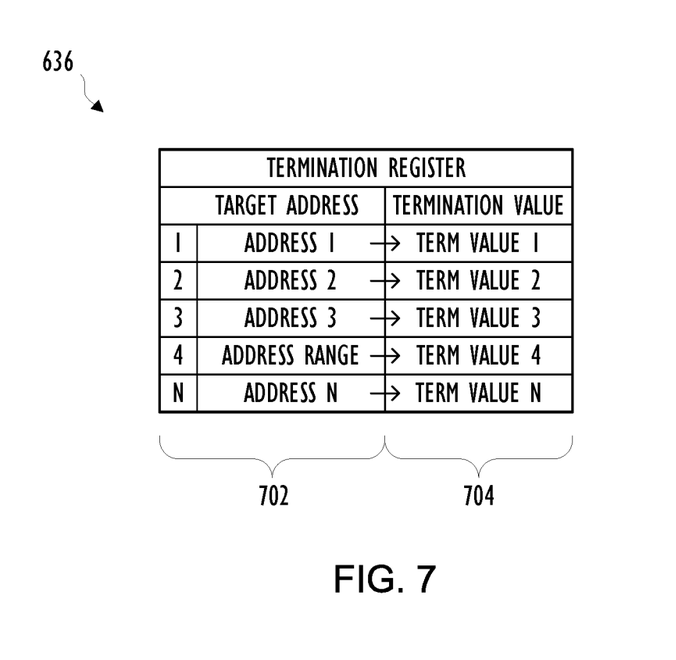
FIG. 7 shows a block diagram representation of a termination register of a memory device according an embodiment of the present disclosure.

Additional detail of an example termination register 636 of FIG. 6 is provided by way of reference to FIG. 7. Termination register 636 may comprise multiple fields for storing termination information (e.g., target addresses and/or termination values) according to various embodiments of the present disclosure. Termination register 636 might be loaded during an initialization operation of the memory device. The target addresses, and termination values if used, might be stored in the memory array 614 to be accessed during the initialization operation to load the termination register 636, for example.

Target address field 702 of termination register 636 stores one or more addresses of memory devices that have been appointed to the particular memory device. For example, if a particular memory device of the memory system is selected (e.g., targeted) for an upcoming memory device operation, memory device 600 will compare the address received on the address bus 606 (e.g., transmitted by the memory system controller) and compare it with target addresses stored in the termination register 636. If the received address matches a target address stored in the termination register 636, memory device 600 recognizes that it is to act as a termination device during the upcoming memory device operation. If the received address does not match a target address stored in the termination register 636, the memory device 600 recognizes that it is not to act as a termination device during the upcoming memory device operation. Although termination register 636 is shown comprising multiple target address fields 1-N 702 and associated termination value fields (e.g., termination resistance values) 704, the termination register 636 might be comprised of a single target address field 702 and associated termination value field 704. Termination register 636 might also be comprised of only one or more target address fields 702 according to various embodiments of the present disclosure. Termination register 636 might comprise only a single target address field 702, for example.

The address information stored in the target address fields 702 might comprise the actual address of targeted memory devices of the memory system. The target address information might also correspond to one or more targeted memory addresses, such as a value representing a range of addresses, for example. Memory device 600 might be appointed to be a termination device for any targeted memory device in the memory system that is covered by the range of addresses stored in the target address fields 702, for example. It should be noted that a termination register 636 of a particular memory device might contain the address of the particular memory device itself, along with addresses of memory devices different from the particular memory device, for example. Thus, a memory device might act as a termination device to itself and/or a different memory device according to various embodiments of the present disclosure.

Figure 8:
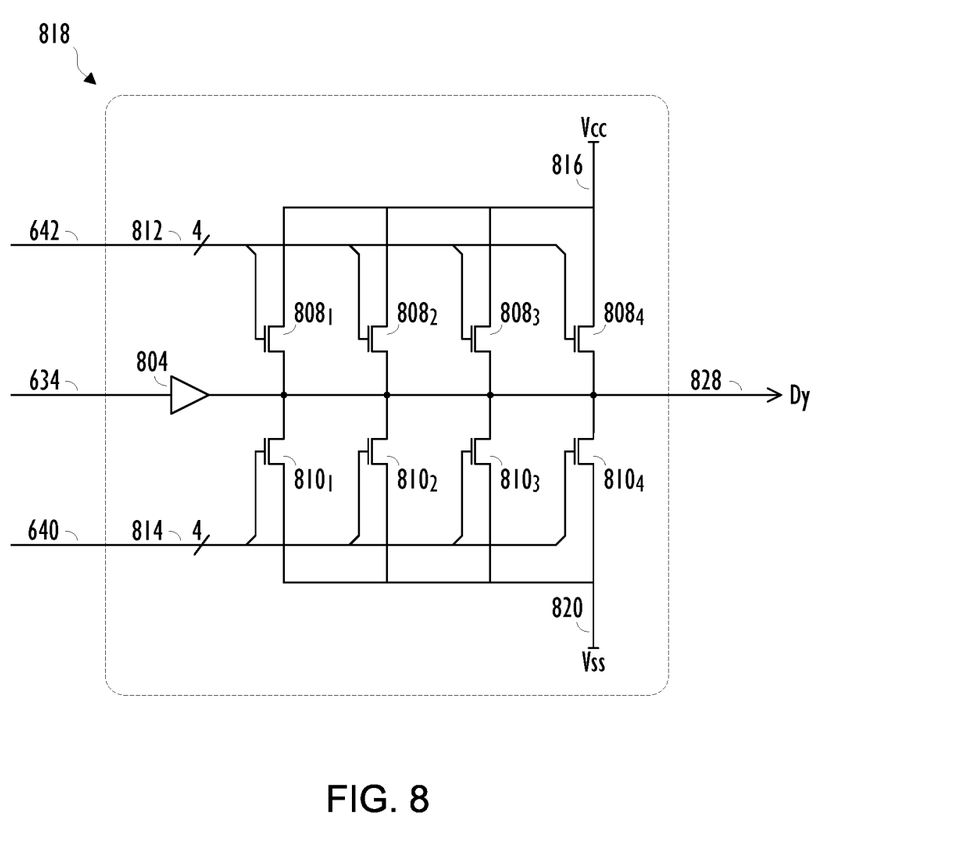
FIG. 8 shows a schematic representation of a driver circuit of a memory device according to an embodiment of the present disclosure.

FIG. 8 shows a more detailed diagram of the termination circuitry comprising one or more of the output drivers 618 of FIG. 6. FIG. 8 illustrates a single output driver circuit 818. Output driver circuit 818 comprises a driver 804 which is configured to drive the data node 828 responsive to a logic level of one of the signal lines 634, such as during a memory device read operation of the memory device 600. The data node 828 might be one of the plurality of data I/O nodes 628 coupled to the data bus 608, for example. Output driver circuit 818 also comprises a plurality of pull-up devices 808, such as the transistors shown coupled between the signal line 828 and a voltage source 816, such as a supply potential Vcc. However, other voltage sources might be coupled to pull-up devices 808, for example. The control gates of each of the pull-up devices 808 may be coupled by signal lines 812 to receive control signals driven on the termination control signal lines 642 by the termination control circuitry 638, for example. Signal lines 812 might comprise four discrete signal lines, one signal line coupled to each control gate of the four pull-up devices 808. Signal lines 812 are shown as a single bus to improve readability of the figure.

Output driver circuit 818 also comprises a plurality of pull-down devices 810, such as the transistors shown coupled between the signal line 828 and a reference source, such as Vss 820, for example. Similar to the pull-up devices 808, the control gates of each of the pull-down devices 810 may be coupled by signal lines 814 to receive control signals driven on the termination control signal lines 640 by the termination control circuitry 638, for example. Signal lines 814 might comprise four discrete signal lines, one signal line coupled to each control gate of the four pull-down devices 810. Signal lines 814 are also shown as a single bus to improve readability of the figure. Although depicted as transistors in FIG. 8, pull-up devices 808 and pull-down devices 810 may include other configurations, such as a switch in series with a resistance.

The output driver circuit 818 configuration shown in FIG. 8 allows for the termination control circuitry 638 to selectively couple any combination of the pull-up devices 808 and/or pull-down devices 810 while the memory device is acting as a termination device. For example, each pull-up device 808 and/or each pull-down device 810 might be configured to exhibit a different termination resistance when activated. This provides additional flexibility in configuring the termination circuitry to adjust the input impedance of the particular data node 828 when the memory device is operating as a termination device. However, transistors 808 and/or transistors 810 might all have the same termination resistance according to various embodiments of the present disclosure.

As discussed above, a memory device according to one or more embodiments of the present disclosure might act as a termination device for itself. A particular configuration of pull-up devices 808 and/or pull-down devices 810 might be activated while the driver 804 drives the signal line 828 responsive to a logic level of one of the signal lines 634, for example.

It should be noted that the various embodiments are not limited to four pull-up devices 808 and/or four pull-down devices 810 as are shown in FIG. 8. Additional embodiments might comprise more or less pull-up and/or pull-down devices. For example, signal lines 812, 814 might each comprise six signal lines to facilitate individual selection (e.g., activation) of termination devices in an embodiment incorporating six pull-up and six pull-down components in the termination circuitry, for example. According to one or more embodiments of the present disclosure, individual lines of signal lines 812, 814 might be coupled to multiple control gates of their respective pull-up 808 and/or pull-down 810 devices. For example, the control gates of pull-up devices 8081.2 might be coupled to a single line of signal lines 812 and the control gates of pull-down devices 8101.2 might be coupled to a single line of signal lines 814.

As discussed above, various embodiments according to the present disclosure might store a termination value along with a stored target address in a memory device configured to operate as a termination device. According to one or more of the embodiments, the termination control circuitry 638 might also selectively adjust the termination circuitry (e.g., activate one or more pull-up devices 808 and/or pull-down devices 810) in the output driver circuits 818 in response to a stored termination value associated with a particular stored target address. According to various embodiments of the present disclosure, the termination value may be directly indicative of a particular impedance characteristic. According to one or more embodiments, the termination value might be a value indicative of an activation pattern of the pull-up devices 808 and pull-down devices 810 to obtain the particular impedance characteristic of signal line 828.

Figure 9:
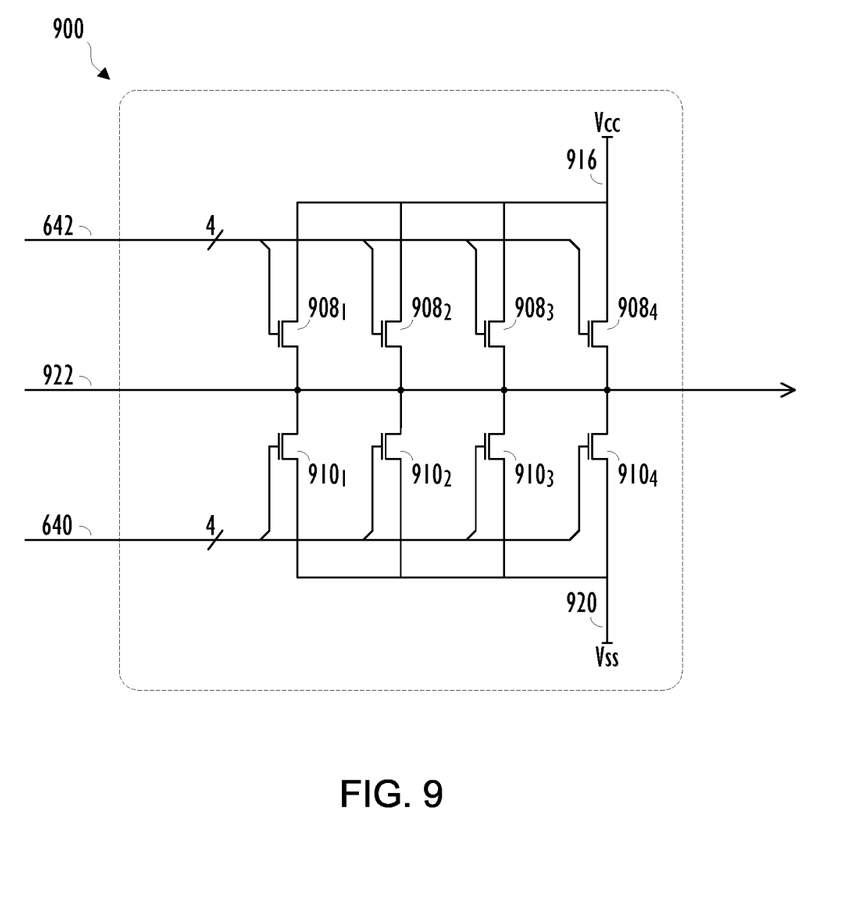
FIG. 9 shows a schematic representation of a driver circuit of a memory device according to an embodiment of the present disclosure.

FIG. 9 illustrates additional termination circuitry 900 according to various embodiments of the present disclosure. The termination circuitry 900 of FIG. 9 provides termination for additional signal lines coupled to a memory device. Node 922 might comprise one of the control signal nodes 620 shown in FIG. 6, for example. Termination circuitry 900 might be provided to selectively adjust the impedance seen by one or more of a clock signal, data strobe signal, and/or other control signals coupled to the memory device 600, for example.

The individual termination devices of termination circuitry 900, such as pull-up devices 908 and pull-down devices 910, might be controlled by the same control signal lines 640, 642 as discussed with respect to activating the pull-up devices 808 and pull-down devices 810 shown in FIG. 8. Each of the pull-up devices 908 and pull-down devices 910 might have the same, or might have different on resistances, such as discussed above with respect to FIG. 8. The termination devices 908, 910 of FIG. 9 are shown coupled between a voltage source 916 (e.g., Vcc) and a reference source (e.g., Vss) 920, for example.

Termination circuitry 900 shown in FIG. 9 might be activated along with the termination circuitry discussed with respect to FIG. 8, such as during a memory device operation, for example. The termination register 636 discussed with respect to FIG. 7 might also comprise additional data fields (not shown.) The additional data fields might indicate for which stored addresses the memory device is to activate the termination circuitry of FIG. 9 and, according to at least one embodiment, what termination resistance value the circuitry of FIG. 9 is to be configured to apply to node 922, for example. Thus, according to one or more embodiments, the termination circuitry 900 of FIG. 9 might be configured in response to a particular stored termination resistance value and/or might be configured to the same termination resistance value as the termination circuitry of FIG. 8, for example.

CONCLUSION

In summary, one or more embodiments of the present disclosure provide methods of selecting one or more memory devices to facilitate selective signal line termination for signal lines coupled to one or more memory devices. Thus, various embodiments according to the present disclosure facilitate, for example, adjustment of the input impedance of one or more input and/or output data nodes of a particular memory device, for example.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. An apparatus, comprising:
a first plurality of signal lines;
a second plurality of signal lines;
a controller connected to the first plurality of signal lines and connected to the second plurality of signal lines;
a first die connected to the first plurality of signal lines and connected to the second plurality of signal lines, and comprising first termination circuitry connected to a particular signal line of the second plurality of signal lines; and
a second die connected to the first plurality of signal lines and connected to the second plurality of signal lines, and comprising second termination circuitry connected to the particular signal line;
wherein the first die is configured to activate the first termination circuitry to adjust an input impedance in response to receiving a particular combination of signal values on the first plurality of signal lines; and
wherein the second die is configured to deactivate the second termination circuitry in response to receiving the particular combination of signal values on the first plurality of signal lines.

2. The apparatus of claim 1, further comprising:
an address bus comprising the first plurality of signal lines for communication of address signals from the controller to the first die and to the second die; and
a data bus comprising the second plurality of signal lines for communication of data between controller and the first die and between the controller and the second die.

3. The apparatus of claim 2, wherein the first plurality of signal lines is a subset of the second plurality of signal lines.

4. The apparatus of claim 1, further comprising:
an address bus comprising the first plurality of signal lines for communication of address signals from the controller to the first die and to the second die; and
a plurality of control signal lines comprising the second plurality of signal lines for communication of control signals from the controller to the first die and to the second die.

5. The apparatus of claim 4, wherein the first plurality of signal lines is mutually exclusive of the second plurality of signal lines.

6. The apparatus of claim 5, wherein the control signals comprise control signals selected from a group consisting of an address latch enable signal, a command latch enable signal, a data strobe signal, and a clock signal.

7. The apparatus of claim 1, wherein the second die is configured to activate the second termination circuitry in response to receiving a second combination of signal values, different than the particular combination of signal values, on the first plurality of signal lines, and wherein the first die is configured to deactivate the first termination circuitry in response to receiving the second combination of signal values on the first plurality of signal lines.

8. The apparatus of claim 1, further comprising:
a third die connected to the first plurality of signal lines and connected to the second plurality of signal lines, and comprising third termination circuitry connected to the particular signal line;
wherein the third die is configured to activate the third termination circuitry in response to receiving the particular combination of signal values on the first plurality of signal lines.

9. The apparatus of claim 8, wherein the first die is further configured to activate the first termination circuitry in response to receiving the particular combination of signal values on the first plurality of signal lines to apply a first termination resistance value to the particular signal line, and wherein the third die is further configured to activate the third termination circuitry in response to receiving the particular combination of signal values on the first plurality of signal lines to apply a second termination resistance value, different than the first termination resistance value, to the particular signal line.

10. The apparatus of claim 8, wherein the first die is further configured to activate the first termination circuitry in response to receiving the particular combination of signal values on the first plurality of signal lines to apply a first termination resistance value to the particular signal line, and wherein the third die is further configured to activate the third termination circuitry in response to receiving the particular combination of signal values on the first plurality of signal lines to apply the first termination resistance value to the particular signal line.

11. An apparatus, comprising:
a first plurality of signal lines;
a second plurality of signal lines;
a controller connected to the first plurality of signal lines and connected to the second plurality of signal lines;
a first die connected to the first plurality of signal lines and connected to the second plurality of signal lines, wherein the first die comprises first termination circuitry connected to a particular signal line of the second plurality of signal lines, and wherein the first termination circuitry comprises a first plurality of pull-up devices and a first plurality of pull-down devices; and
a second die connected to the first plurality of signal lines and connected to the second plurality of signal lines, wherein the second die comprises second termination circuitry connected to the particular signal line, and wherein the second termination circuitry comprises a second plurality of pull-up devices and a second plurality of pull-down devices;
wherein the first die is configured to activate a first pattern of pull-up devices and pull-down devices of the first plurality of pull-up devices and the first plurality of pull-down devices in response to receiving a particular combination of signal values on the first plurality of signal lines; and
wherein the second die is configured to activate a second pattern, different than the first pattern, of pull-up devices and pull-down devices of the second plurality of pull-up devices and the second plurality of pull-down devices in response to receiving the particular combination of signal values on the first plurality of signal lines.

12. The apparatus of claim 11, wherein the first plurality of signal lines is a subset of the second plurality of signal lines.

13. The apparatus of claim 11, wherein the first plurality of signal lines is mutually exclusive of the second plurality of signal lines.

14. The apparatus of claim 13, wherein the first plurality of signal lines are for communication of control signals selected from a group consisting of an address latch enable signal, a command latch enable signal, a data strobe signal, and a clock signal.

15. The apparatus of claim 11, wherein the first die is configured to activate a third pattern of pull-up devices and pull-down devices of the first plurality of pull-up devices and the first plurality of pull-down devices in response to receiving a second combination of signal values, different than the particular combination of signal values, on the first plurality of signal lines, and wherein the second die is configured to deactivate the second plurality of pull-up devices and the second plurality of pull-down devices in response to receiving the second combination of signal values on the first plurality of signal lines.

16. The apparatus of claim 15, wherein the third pattern is different than the first pattern.

17. The apparatus of claim 11, wherein each pull-up device of the first plurality of pull-up devices is configured to exhibit a different termination resistance when activated than each remaining pull-up device of the first plurality of pull-up devices, and wherein each pull-down device of the first plurality of pull-down devices is configured to exhibit a different termination resistance when activated than each remaining pull-down device of the first plurality of pull-down devices.

18. The apparatus of claim 11, further comprising:
a third die connected to the first plurality of signal lines and connected to the second plurality of signal lines, wherein the third die comprises third termination circuitry connected to the particular signal line, and wherein the third termination circuitry comprises a third plurality of pull-up devices and a third plurality of pull-down devices;
wherein the third die is configured to activate a third pattern of pull-up devices and pull-down devices of the third plurality of pull-up devices and the third plurality of pull-down devices in response to receiving the particular combination of signal values on the first plurality of signal lines.

19. The apparatus of claim 18, wherein the third pattern is different than the first pattern.

20. A memory system, comprising:
a first memory device comprising a first plurality of die;
a second memory device comprising a second plurality of die;
a controller;
an address bus comprising a first plurality of signal lines connected to the first memory device, connected to the second memory device, and connected to the controller; and
a data bus comprising a second plurality of signal lines connected to the first memory device, connected to the second memory device, and connected to the controller;
wherein each die of the first plurality of die comprises respective termination circuitry connected to a particular signal line of the second plurality of signal lines and configured to adjust an input impedance of the respective particular signal line;
wherein each die of the second plurality of die comprises respective termination circuitry connected to the particular signal line;
wherein the first memory device is configured to activate the respective termination circuitry of at least one die of the first plurality of die in response to receiving a particular combination of signal values on the first plurality of signal lines; and
wherein the second memory device is configured to deactivate the respective termination circuitry of at least one die of the second plurality of die in response to receiving the particular combination of signal values on the first plurality of signal lines.

21. The memory system of claim 20, wherein the first plurality of signal lines and the second plurality of signal lines are a same plurality of signal lines.

22. The memory system of claim 20, wherein the second memory device is further configured to activate the respective termination circuitry of at least one other die of the second plurality of die in response to receiving the particular combination of signal values on the first plurality of signal lines.

23. The memory system of claim 22, wherein the first memory device is further configured to apply a first termination resistance value to the particular signal line in response to activating the respective termination circuitry of the at least one die of the first plurality of die, and wherein the second memory device is further configured to apply a second termination resistance value, different than the first termination resistance value, to the particular signal line in response to activating the respective termination circuitry of the at least one other die of the second plurality of die.

24. The memory system of claim 20, wherein the particular combination of signal values corresponds to an address of a particular die selected from a group consisting of the first plurality of die and the second plurality of die.

25. The memory system of claim 20, wherein the particular combination of signal values corresponds to an address of a particular die of the first plurality of die, and wherein the first memory device is configured to deactivate the respective termination circuitry of the particular die in response to receiving the particular combination of signal values on the first plurality of signal lines.

* * * * *

UNITED STATES PATENT AND TRADEMARK OFFICE
CERTIFICATE OF CORRECTION

PATENT NO. : 12,235,760 B2
APPLICATION NO. : 17/851273
DATED : February 25, 2025
INVENTOR(S) : Terry Grunzke

Page 1 of 1

It is certified that error appears in the above-identified patent and that said Letters Patent is hereby corrected as shown below:

In the Specification

| | | |
|---|---|---|
| Column 6, | Line 40, | change "Device 4 316 that" to --Device 4 316 might-- |
| Column 11, | Line 28, | change "devices 8081.2 might be" to --devices 808$_{1,2}$ might be-- |
| Column 11, | Lines 28-29, | change "devices 8101.2 might be" to --devices 810$_{1,2}$ might be-- |

Signed and Sealed this
Twenty-ninth Day of April, 2025

Coke Morgan Stewart
*Acting Director of the United States Patent and Trademark Office*